US009979380B2

(12) United States Patent
McAnally et al.

(10) Patent No.: US 9,979,380 B2
(45) Date of Patent: May 22, 2018

(54) OPTIMIZING PROCESSOR OPERATION IN A PROCESSING SYSTEM INCLUDING ONE OR MORE DIGITAL FILTERS

(75) Inventors: Craig B McAnally, Thornton, CO (US); Paul J Hays, Lafayette, CO (US)

(73) Assignee: Micro Motion, Inc., Boulder, CO (US)

( * ) Notice: Subject to any disclaimer, the term of this patent is extended or adjusted under 35 U.S.C. 154(b) by 1178 days.

(21) Appl. No.: 13/003,349

(22) PCT Filed: Jul. 30, 2008

(86) PCT No.: PCT/US2008/071627
§ 371 (c)(1),
(2), (4) Date: Jan. 10, 2011

(87) PCT Pub. No.: WO2010/014087
PCT Pub. Date: Feb. 4, 2010

(65) Prior Publication Data
US 2011/0138205 A1    Jun. 9, 2011

(51) Int. Cl.
*H03H 17/02* (2006.01)
*G01F 1/84* (2006.01)

(52) U.S. Cl.
CPC ........ *H03H 17/0227* (2013.01); *G01F 1/8436* (2013.01); *H03H 2017/0245* (2013.01); *H03H 2017/0298* (2013.01); *H03H 2220/08* (2013.01)

(58) Field of Classification Search
CPC .................................................. G01F 1/8436
USPC .................................................. 708/300–323
See application file for complete search history.

(56) References Cited

U.S. PATENT DOCUMENTS

| | | | |
|---|---|---|---|
| 3,665,171 A * | 5/1972 | Morrow ............ | H04L 25/03133 367/44 |
| 4,649,507 A * | 3/1987 | Inaba et al. .................... | 708/319 |
| 4,785,411 A * | 11/1988 | Thompson et al. .......... | 708/322 |
| 5,097,482 A * | 3/1992 | Serizawa et al. ............. | 375/233 |
| 5,228,327 A | 7/1993 | Bruck | |
| 5,555,190 A * | 9/1996 | Derby et al. .................... | 702/45 |

(Continued)

FOREIGN PATENT DOCUMENTS

| | | |
|---|---|---|
| EP | 0858159 A2 | 12/1998 |
| JP | 07134058 | 5/1995 |

(Continued)

OTHER PUBLICATIONS

R. Mahesh and A.P. Vinod, "Coefficient Decimation Approach for Realizing Reconfigurable Finite Impulse Response Filters", Circuits and Systems 2008, ISCAS 2008, IEEE International Symposium IEEE, Piscataway, NJ, USA, May 18, 2008 pp. 81-84, XP031391914.

*Primary Examiner* — Chuong D Ngo
(74) *Attorney, Agent, or Firm* — The Ollila Law Group LLC

(57) ABSTRACT

A method for optimizing processor operation in a processing system including one or more digital filters is provided according to the invention. The method includes generating initial filter coefficients for the one or more digital filters of the processing system, determining one or more initial filter coefficients for at least one digital filter of the one or more digital filters that can be dropped and dropping the one or more initial filter coefficients. Dropping the one or more initial filter coefficients reduces a total number of filter coefficients to be used by the processing system.

21 Claims, 5 Drawing Sheets

(56) References Cited

U.S. PATENT DOCUMENTS

| | | | |
|---|---|---|---|
| 5,650,951 A * | 7/1997 | Staver | 708/313 |
| 5,909,384 A * | 6/1999 | Tal et al. | 708/322 |
| 6,151,614 A * | 11/2000 | Ikeda | 708/322 |
| 6,199,022 B1 * | 3/2001 | Cunningham | 702/54 |
| 6,633,894 B1 * | 10/2003 | Cole | 708/300 |
| 6,636,561 B1 * | 10/2003 | Hudson | 375/232 |
| 7,167,883 B2 * | 1/2007 | Greiss et al. | 708/319 |
| 2005/0008105 A1 * | 1/2005 | Agazzi et al. | 375/341 |
| 2005/0027768 A1 * | 2/2005 | Reesor | 708/322 |
| 2006/0265168 A1 * | 11/2006 | Patten et al. | 702/100 |
| 2008/0143984 A1 | 6/2008 | Holderer et al. | |
| 2008/0184815 A1 * | 8/2008 | Bell et al. | 73/861.356 |
| 2012/0209900 A1 * | 8/2012 | Sorokine et al. | 708/309 |

FOREIGN PATENT DOCUMENTS

| | | |
|---|---|---|
| JP | 11098023 | 4/1999 |
| JP | 2001144824 | 5/2001 |
| JP | 2001230826 | 8/2001 |
| RU | 2302707 C2 | 7/2007 |
| WO | 1998015901 A1 | 4/1998 |
| WO | 2006127527 A1 | 11/2006 |
| WO | 2007035376 A2 | 3/2007 |

\* cited by examiner

STANDARD HILBERT FILTER USING 150 COEFFICIENTS

SHORTENED HILBERT FILTER BY DROPPING THE FIRST AND LAST 30 COEFFICIENTS

OPTIMIZING PROCESSOR OPERATION IN A PROCESSING SYSTEM INCLUDING ONE OR MORE DIGITAL FILTERS

BACKGROUND OF THE INVENTION

1. Field of the Invention

The present invention relates to a processing system, and more particularly, to optimizing processor operation in a processing system including one or more digital filters.

2. Statement of the Problem

Vibratory flowmeters typically include a processing system that operates a driver to vibrate a flowtube assembly, receives pick-off sensor signals in response, processes the pick-off sensor response signals, and communicates with external devices. The processing system processes the pick-off sensor response signals in order to generate one or more measurements, such as one or more flow characteristics. The one or more flow characteristics can include a vibration frequency, a phase difference or time difference between leading and lagging portions of a flow tube or tubes, mass flow rate, density, viscosity, pressure, and others.

The processing system can receive and digitize analog inputs. The digitizing may require sampling of the analog signal(s). The processing system runs at a fixed clock rate and samples the pick-off sensor response signals at a fixed sampling rate. According to the Nyquist Theorem, the sampling rate must be at least twice the frequency being sampled.

One processing system application is a flowmeter, such as a vibratory flowmeter, where the processing system receives analog vibrational signals and determines frequency and phase characteristics of the vibrational signals, among other things. In the past, the sampling rate has been set at a high enough frequency to accommodate various models of flowmeters, including low frequency flow meters and high frequency flow meters. This can be done for economic reasons, such as to avoid the manufacturing and tracking of multiple models of flowmeter electronics. Typically, the sampling rate has been set at 2,000 Hertz (i.e., 2 kHz), where most vibratory flowmeters operate at frequencies well below 1 kHz.

In the prior art, processing system speed is generally not a concern. The prior art processing system is typically chosen for durability and capacity. If the processing system has a high enough clock speed, the processing system will be able to adequately process the 2 kHz samples in order to generate the one or more flow characteristics (and may be able to perform additional processing and communications and control functions). Clock speed and sampling rate of the flowmeter electronics are generally configured for wide applicability and therefore have been chosen to significantly exceed flowmeter vibration rates. Processing system power consumption has not been a concern in the prior art and therefore it has been acceptable practice to set a generous sampling rate.

The drawback in using a high sampling rate is that it requires a high processing system clock rate. The high clock rate in turn forces a higher power consumption.

In some applications, it is desired to keep power consumption as low as possible. Consequently, high power consumption by the processing system is problematic.

Aspects of the Invention

In one aspect of the invention, a method for optimizing processor operation in a processing system including one or more digital filters comprises:

generating initial filter coefficients for the one or more digital filters;

determining one or more initial filter coefficients for at least one digital filter of the one or more digital filters that can be dropped; and dropping the one or more initial filter coefficients, wherein dropping the one or more initial filter coefficients reduces a total number of filter coefficients to be used by the processing system.

Preferably, the method further comprises a subsequent step of programming the filter coefficients into the processing system.

Preferably, the dropping further comprises dropping the one or more initial filter coefficients from one or more predetermined digital filters.

Preferably, a digital filter of the one or more digital filters includes non-symmetric filter coefficients.

Preferably, a digital filter of the one or more digital filters includes symmetric filter coefficients.

Preferably, a digital filter of the one or more digital filters includes symmetric filter coefficients and wherein symmetric filter coefficients are dropped singly or in pairs.

Preferably, the method further comprises comparing one or more processing system measurements to a predetermined power usage threshold during operation, if the one or more processing system measurements exceeds the predetermined power usage threshold, then determining one or more operational filter coefficients for at least one digital filter of the one or more digital filters that can be dropped, and dropping the one or more operational filter coefficients, wherein dropping the one or more operational filter coefficients reduces a total number of operational filter coefficients to be used by the processing system during at least a current main loop processing iteration.

In one aspect of the invention, a method for adaptively optimizing processor operation in a processing system including one or more digital filters comprises:

comparing one or more processing system measurements to a predetermined power usage threshold during operation;

if the one or more processing system measurements exceeds the predetermined power usage threshold, then determining one or more filter coefficients for at least one digital filter of the one or more digital filters that can be dropped; and dropping the one or more filter coefficients, wherein dropping the one or more filter coefficients reduces a total number of filter coefficients to be used by the processing system.

Preferably, the dropping further comprises dropping one or more filter coefficients from one or more predetermined digital filters.

Preferably, the method further comprises iteratively performing the comparing, determining, and processing steps.

Preferably, a digital filter of the one or more digital filters includes non-symmetric filter coefficients.

Preferably, a digital filter of the one or more digital filters includes symmetric filter coefficients.

Preferably, a digital filter of the one or more digital filters includes symmetric filter coefficients and wherein symmetric filter coefficients are dropped singly or in pairs.

Preferably, the method further comprises determining a number of operational filter coefficients to be dropped based on an amount by which the one or more processing system measurements exceeds the predetermined power usage threshold.

Preferably, the method further comprises the preliminary steps of generating initial filter coefficients for the one or more digital filters, determining one or more initial filter coefficients for at least one digital filter of the one or more digital filters that can be dropped, and dropping the one or more initial filter coefficients, wherein dropping the one or more initial filter coefficients reduces the total number of filter coefficients to be used by the processing system.

In one aspect of the invention, a method for optimizing processor operation in a processing system including one or more digital filters comprises:

generating filter coefficients for the one or more digital filters;

determining one or more initial filter coefficients and one or more operational filter coefficients for at least one digital filter of the one or more digital filters that can be dropped;

dropping the one or more initial filter coefficients, wherein dropping the one or more initial filter coefficients reduces a total number of filter coefficients to be used by the processing system;

programming the filter coefficients into the processing system;

comparing one or more processing system measurements to a predetermined power usage threshold during operation; and if the one or more processing system measurements exceeds the predetermined power usage threshold, then dropping the one or more operational filter coefficients, wherein dropping the one or more filter coefficients further reduces a total number of filter coefficients to be used by the processing system.

Preferably, the dropping further comprising dropping the one or more initial filter coefficients from one or more predetermined digital filters.

Preferably, a digital filter of the one or more digital filters includes non-symmetric filter coefficients.

Preferably, a digital filter of the one or more digital filters includes symmetric filter coefficients.

Preferably, a digital filter of the one or more digital filters includes symmetric filter coefficients and wherein symmetric filter coefficients are dropped singly or in pairs.

Preferably, the method further comprises iteratively performing the comparing and dropping steps for the one or more operational filter coefficients.

Preferably, the method further comprises determining a number of operational filter coefficients to be dropped based on an amount by which the one or more processing system measurements exceeds the predetermined power usage threshold.

DESCRIPTION OF THE DRAWINGS

The same reference number represents the same element on all drawings. It should be understood that the drawings are not necessarily to scale.

DETAILED DESCRIPTION OF THE INVENTION

FIGS. 1-6 and the following description depict specific examples to teach those skilled in the art how to make and use the best mode of the invention. For the purpose of teaching inventive principles, some conventional aspects have been simplified or omitted. Those skilled in the art will appreciate variations from these examples that fall within the scope of the invention. Those skilled in the art will appreciate that the features described below can be combined in various ways to form multiple variations of the invention. As a result, the invention is not limited to the specific examples described below, but only by the claims and their equivalents.

Figure 1:
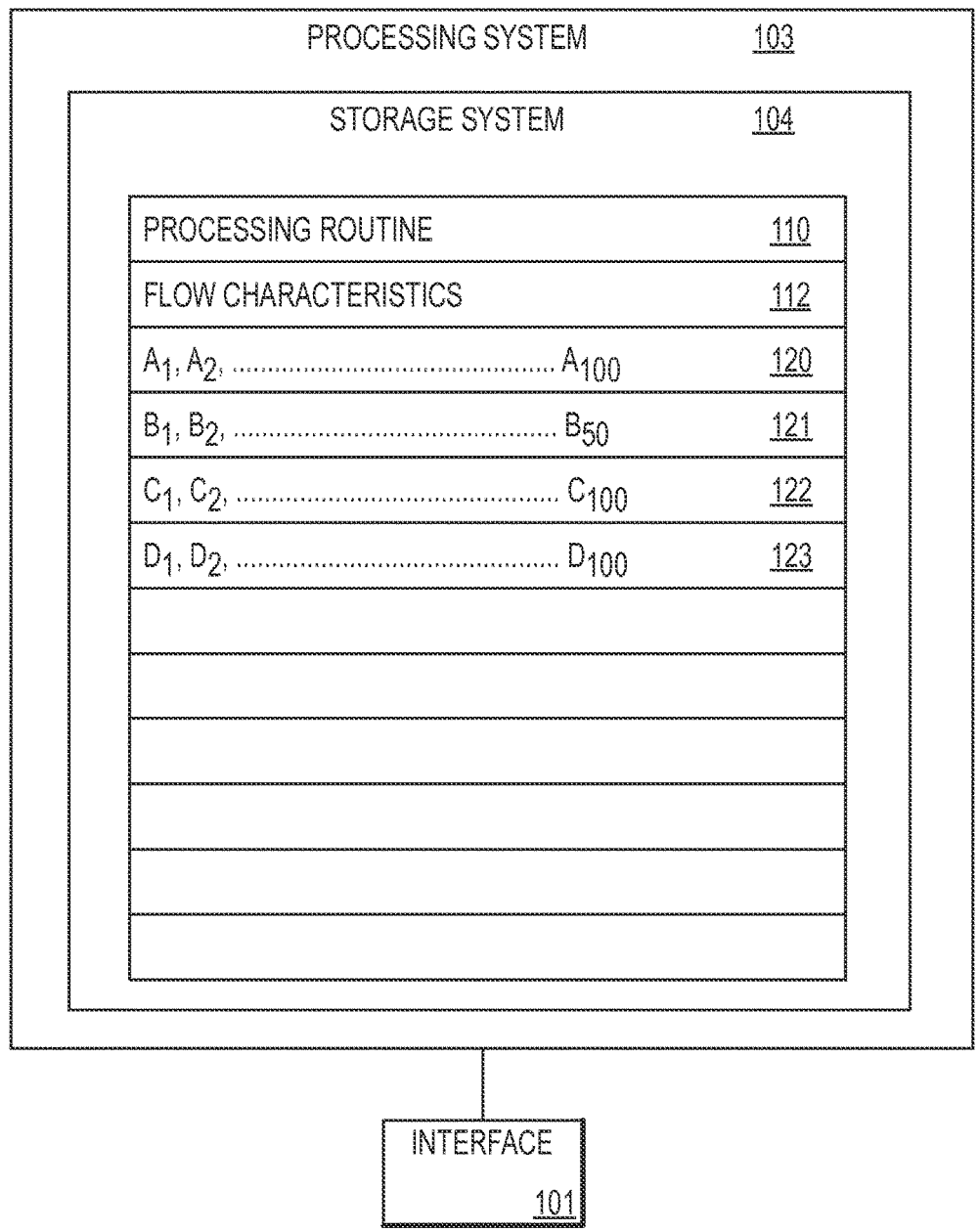
FIG. 1 shows a processing system according to an embodiment of the invention.

FIG. 1 shows a processing system 103 according to an embodiment of the invention. The processing system 103 can include an interface 101. The processing system 103 receives sensor signals from a sensor of some manner. For example, in one embodiment the sensor comprises a vibratory flowmeter assembly including pick-off/velocity sensor signals that sense a vibrational response of a flowmeter assembly and generate corresponding analog vibrational response signals. The processing system 103 processes the sensor signals in order to obtain one or more processing system measurements, such as flow characteristics 112 of a flow material flowing through a flowmeter assembly, for example. Consequently, the processing system 103 can determine one or more of a phase difference, a frequency, a time difference (Δt), a density, a mass flow rate, a viscosity, and a volume flow rate from the sensor signals of a flowmeter assembly, for example.

The processing system 103 can comprise a general purpose computer, a microprocessing system, a logic circuit, or some other general purpose or customized processing device. The processing system 103 can be distributed among multiple processing devices. The processing system 103 can include any manner of integral or independent electronic storage medium, such as the storage system 104.

The storage system 104 can store parameters and data, software routines, constant values, and variable values. In addition, the storage system 104 can store one or more digital filters that are employed by the processing routine 110, wherein a digital filter includes a series of coefficients.

In the embodiment shown, the storage system 104 stores a first digital filter A 120, a second digital filter B 121, a third digital filter C 122, and a fourth digital filter D 123. The filter sets shown are given merely for illustration. It should be understood that the processing system 103 can include any needed number and type of digital filters.

The digital filters can comprise any manner of digital filters, including finite impulse response (FIR) and infinite impulse response (IIR) filters. The digital filters can comprise low pass, bandpass, or high pass filters. The digital filters can perform filtering, phase-shifting, and windowing functions, among other things. Other filter types and filter uses are contemplated and are within the scope of the description and claims.

A digital filter can be used to eliminate frequencies outside of a frequency band of interest, such as through the use of any variety of low pass, bandpass, or high pass filter.

A digital filter can be used for decimation, wherein some samples are eliminated in order to reduce the sampling rate. Decimation can be used to vary the number of frequency bands to be processed, for example.

A digital filter can be used for phase-shifting a digital signal waveform, such as through use of a Hilbert transform or Hilbert filter. The Hilbert transform or filter can phase-shift the input waveform by ninety degrees, for example. The phase-shifting can be used in determining the one or more flow characteristics.

A digital filter can be used for windowing, wherein frequencies outside of a window are eliminated. Windowing can be performed after a processing stage, such as to cut off tails generated by Fourier processing.

In some embodiments, a measurement can be derived from a phase-shifting of one or more received signals. This advantageously reduces the required processing time.

A digital filter includes a set or chain of coefficients that correspond to and are applied against the digitally sampled waveform of interest. The filter is designed based on the desired output to be obtained from the input waveform. When the digital input waveform is filtered using the coefficients of the digital filter, the filtering process passes at least a portion of the frequencies or frequency bands of interest, while rejecting non-desired frequencies or frequency bands.

The series of filter coefficients can be symmetric. For example, the first and last coefficients ($A_1$ and $A_{100}$) of the first digital filter A 120 can be the same, the second and second-to-last coefficients ($A_2$ and $A_{99}$) can be the same, and so on.

The series of coefficients can be non-symmetric. Each coefficient can be unique, such as shown in the second digital filter B 121.

The number of filter coefficients may depend on various factors. For example, the number of filter coefficients can be chosen according to the frequency span of the input waveform, the frequency span of the filtered result (i.e., the width of the filter transfer function), the desired shape of the filter transfer function, the sharpness or roll-off of the transfer function, etc.

Filter performance can generally be improved and/or the transform function can be formed in a more complex shape if a greater number of filter coefficients are employed. However, the increased number of multiplications (or other filtering operations) necessitated by the large number of coefficients will increase the required processing time. Consequently, the desired resolution and accuracy entails a trade-off between frequency discrimination versus processing time.

In addition, the processing system 103 can implement multiple digital filters. Processing the input waveform through multiple digital filters in a single iteration can consume considerable processing time.

A high sampling rate leads to a large number of filtering operations. A large number of filtering operations subsequently cause an undesirably long loop time and consequently a slower response by the processing system 103. However, the sampling frequency can be limited if the instrument coupled to the processing system 103, such as a flowmeter providing a vibrational frequency, is low enough that the sampling frequency can be reduced and yet still meet the Nyquist criteria.

A large loop time may prevent the processing of all incoming samples. Further, a large loop time will result in a high level of power consumption by the processing system 103. If the processing system 103 takes too much processing time per main loop iteration, other computations and/or processing routines can be affected. The end result can be an inaccurate and unreliable result and even reset or shut-down of the processing system 103.

Figure 2:
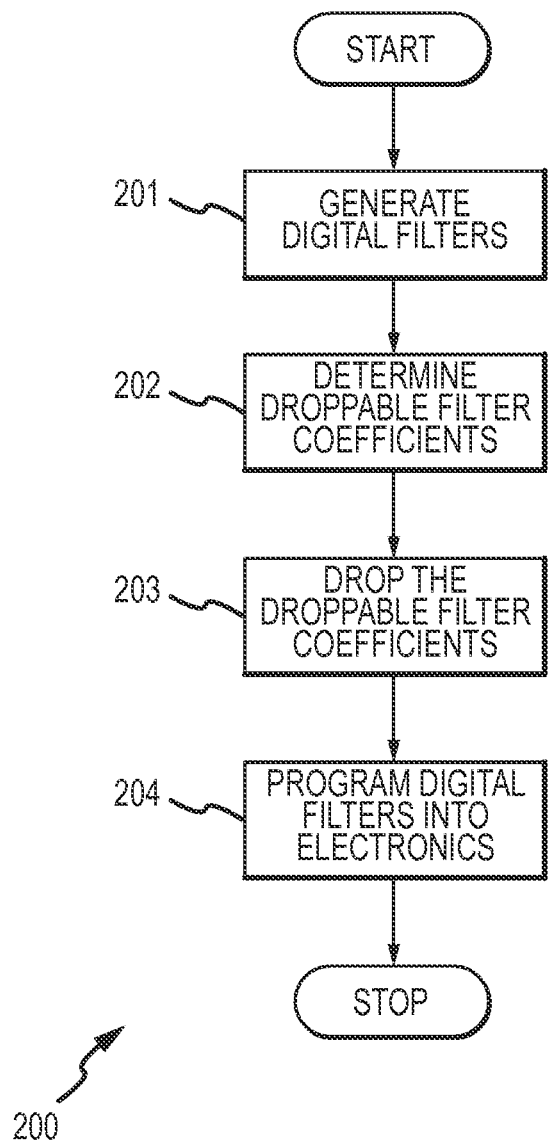
FIG. 2 is a flowchart of a method for optimizing processor operation in a processing system including one or more digital filters according to an embodiment of the invention.

FIG. 2 is a flowchart 200 of a method for optimizing processor operation in a processing system including one or more digital filters according to an embodiment of the invention. The method can be employed to optimize response time. The method can be employed to optimize power consumption. In step 201, one or more digital filters are generated for use with the processing system, including initial filter coefficients.

In step 202, one or more initial filter coefficients of at least one digital filter are determined to be droppable. The one or more initial filter coefficients are determined to be able to be dropped without unacceptably affecting the filtering operation. Dropping filter coefficients will result in an increase in noise in the filter output. Dropping filter coefficients will result in a decrease in processor bandwidth. As a consequence, coefficient dropping is a trade-off between processing speed and power consumption versus noise and processor bandwidth.

The one or more initial filter coefficients can comprise coefficients of any of the digital filters of the processing system. The one or more initial filter coefficients can be targeted from predetermined filters.

In step 203, the identified one or more initial filter coefficients are dropped from respective filters. Dropping the one or more initial filter coefficients reduces a total number of filter coefficients to be used by the processing system. The one or more initial filter coefficients can be therefore removed from one or more digital filters. In some embodiments, dropped coefficients are dropped from either (or both) ends of a string of coefficients making up the digital filter. However, the dropped filter coefficients can occur anywhere in a string of filter coefficients. The remaining initial filter coefficients are programmed into the processing system.

Figure 3:
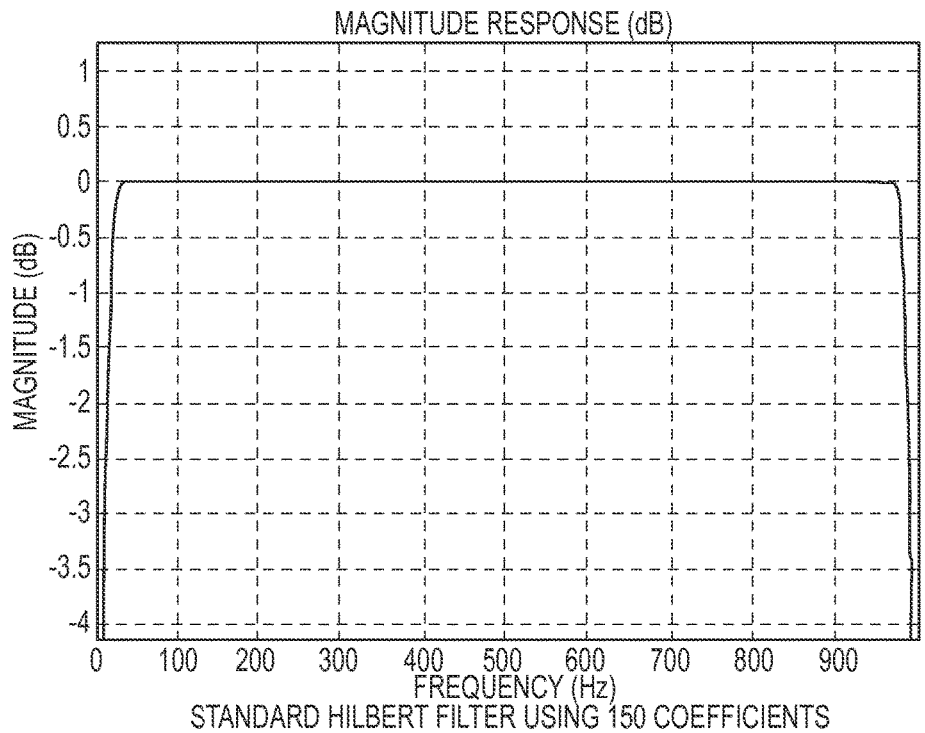
FIG. 3 shows a filter response for a standard Hilbert digital filter formed with one hundred fifty filter coefficients.

FIG. 3 shows a filter response for a standard Hilbert digital filter formed with one hundred fifty filter coefficients. In this figure, the filter response is shaped and determined by the full one hundred fifty filter coefficients. Increasing the number of coefficients can increase the roll-off rate of signals toward either end of the filter envelope and can change the shape of the frequency response. As a consequence, increasing the number of filter coefficients can improve the filtering result at the expense of increased processing time.

Figure 4:
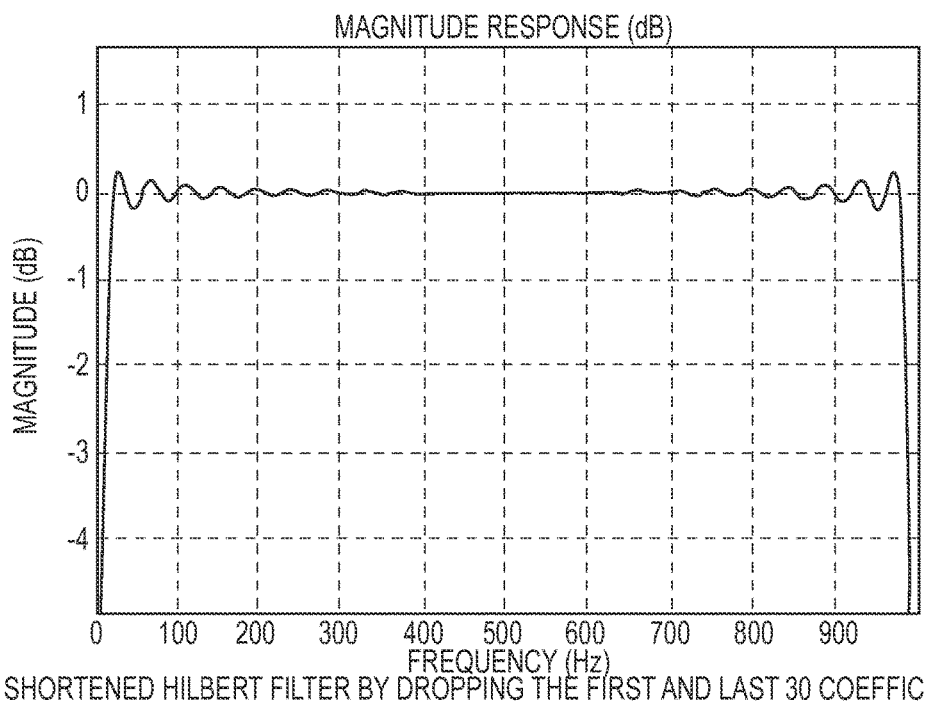
FIG. 4 shows the filter of FIG. 3 where some of the filter coefficients have been dropped according to an embodiment of the invention.

FIG. 4 shows the filter of FIG. 3 where some of the filter coefficients have been dropped according to an embodiment of the invention. In this example, thirty coefficients have been dropped. It can be seen that the effect is confined to the left and right edges of the filter transfer function and the center region of the filter transfer function is relatively flat and unchanged. Changes to the center region may have some effects on the end result of the filtering operation. In contrast, dropping coefficients at the ends of the filter mainly affects the filter response at the periphery and therefore has minimal effect on the desired signal.

The one or more filter coefficients can include two or more coefficients dropped from a single digital filter. For example, where a digital filter comprises symmetric or partially symmetric coefficients, a pair of coefficients can be dropped. Further, even where a digital filter does not have symmetric coefficients, multiple filter coefficients can be dropped, such as a number of adjacent coefficients at an end of a filter.

The downside to dropping filter coefficients may be a drop in repeatability in the filtered result due to increased noise. This is not a given, however, and if a minimal number are dropped there may not be any effect on the filtering of the vibrational waveform.

Referring again to FIG. 2, in step 204 the one or more digital filters are programmed into an appropriate electronics, such as the digital filters 120-123 in the processing system 103 shown in FIG. 1. For example, the one or more digital filters are programmed into the storage system 104. The one or more digital filters 120-123 can now be used by the processing routine 110. It should be understood that the digital filters can be stored in any manner, including in onboard processing system memory, as shown. Alternatively, the digital filters can be stored in any manner of external storage coupled to the processing system 103.

Figure 5:
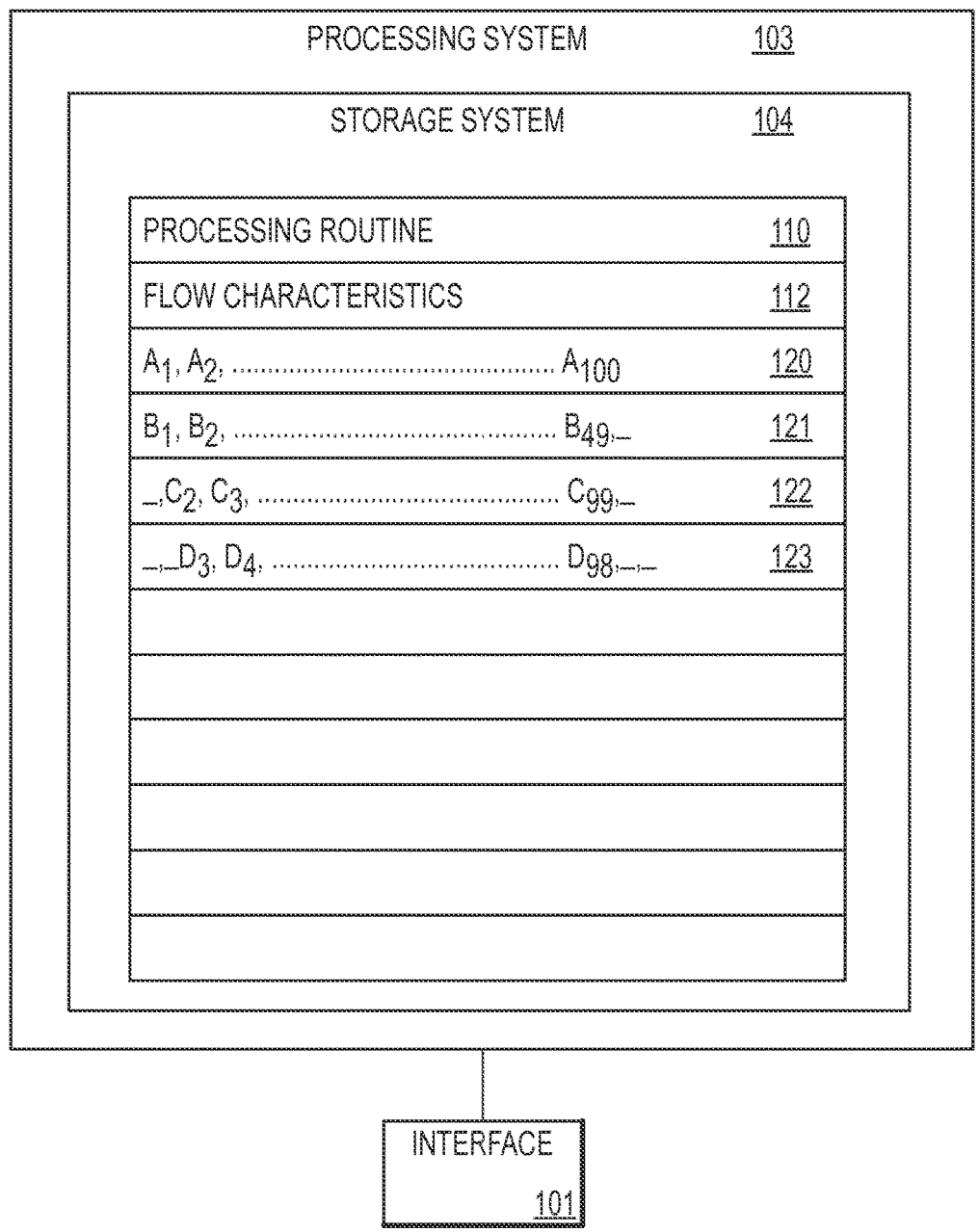
FIG. 5 shows the processing system after filter coefficients have been dropped according to an embodiment of the invention.

FIG. 5 shows the processing system 103 after filter coefficients have been dropped according to an embodiment of the invention. The figure shows several examples of filter coefficient dropping when compared to the processing system 103 of FIG. 1.

The first digital filter A 120 has not been changed. The second digital filter B 121 has had a last filter coefficient, coefficient $B_{50}$, dropped from the filter. The third digital filter C 122 has first and last filter coefficients $C_1$ and $C_{100}$ dropped from the filter. The fourth digital filter D 123 has the two first coefficients $D_1$ and $D_2$ and the last two coefficients $D_{99}$ and $D_{100}$ dropped from the filter. Each of the affected filters will as a consequence require fewer filtering operations.

Figure 6:
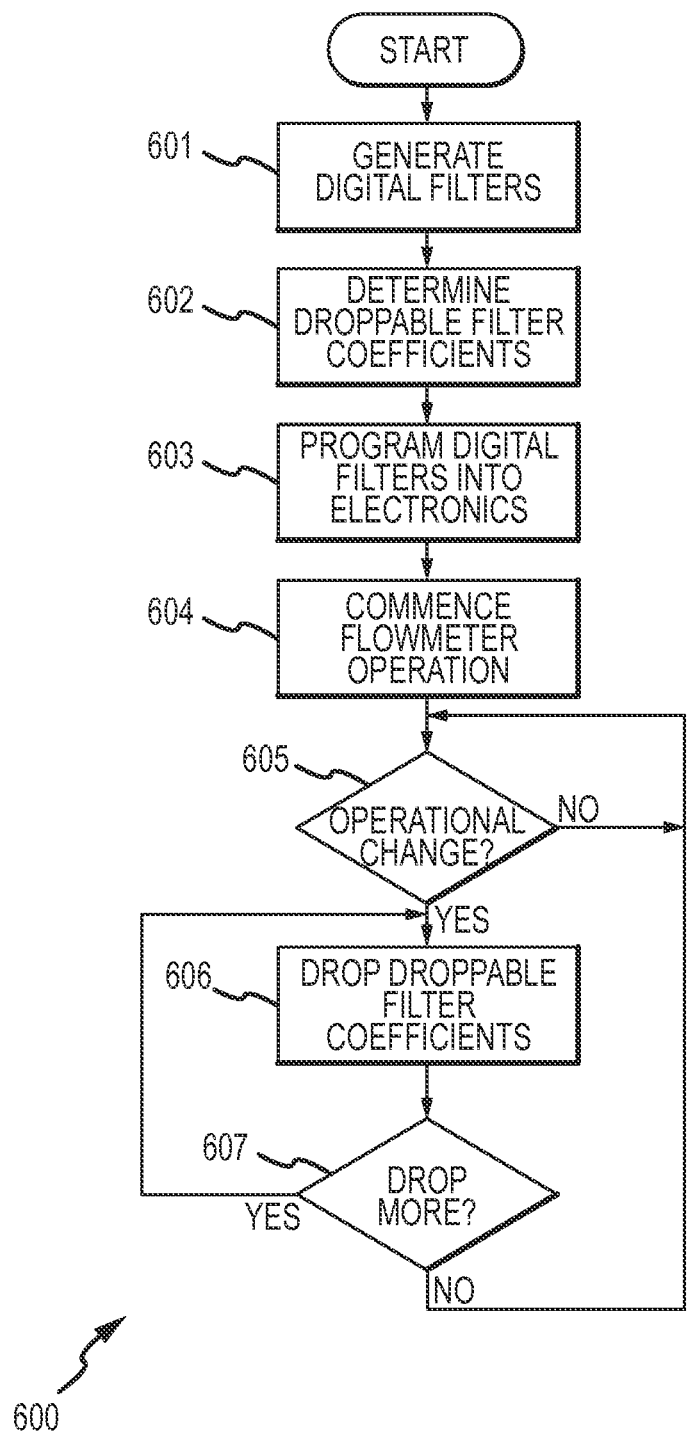
FIG. 6 is a flowchart of a method for adaptively optimizing processor operation in a processing system including one or more digital filters according to an embodiment of the invention.

FIG. 6 is a flowchart 600 of a method for adaptively optimizing processor operation in a processing system including one or more digital filters according to the invention. As previously discussed, filter coefficients can be dropped in order to speed up a response time of the processing system and/or in order to reduce power consumption. In step 601, the one or more digital filters are generated for use in the processing system, as previously discussed.

In step 602, one or more filter coefficients of at least one digital filter are determined to be droppable, as previously discussed. The filter coefficients to be dropped can comprise initial filter coefficients, operational filter coefficients, or both initial and operational filter coefficients. The initial filter coefficients are to be dropped before programming the processing system and the operational filter coefficients are to be temporarily or permanently dropped during operation of the processing system.

In step 603, the one or more digital filters are programmed into the processing system. The droppable operational filter coefficients can be still included in the digital filters and can comprise a designation of filter coefficients to be adaptively dropped during operation or at some point in the future.

Alternatively, a first (initial) portion of the designated droppable filter coefficients can be dropped before programming the electronics and a second (operational) portion can be adaptively dropped during operation. Consequently, this flowchart could be modified to include step 203 of FIG. 2 before step 603 of this figure.

In step 604, processing system operation is commenced.

In step 605, operational conditions are monitored by the processing system. If there is an operational change, such as a change in the one or more processing system measurements, then the method proceeds to step 606. Otherwise, if operation is within normal bounds (see below), then the method loops back to step 605 and monitors for a change in operational conditions.

The monitoring can include comparing the one or more processing system measurements to a predetermined operational threshold, wherein the predetermined operational threshold reflects or relates to an undesirable electrical power usage level. The predetermined operational threshold can comprised a fixed or dynamic threshold and can be linked to or controlled by internal variables in the processing system.

In some vibratory flowmeter embodiments, the predetermined operational threshold can comprise a time difference ($\Delta t$) threshold. The time difference ($\Delta t$) comprises a time difference in signals from the pick-off sensors and therefore between leading and lagging portions of a flow conduit of the vibratory flowmeter. Consequently, if the time difference ($\Delta t$) becomes too large, then the vibrational amplitude being generated by the vibratory flowmeter has become excessive and will likely require a high level of power consumption. The power consumption can consequently be reduced somewhat by dropping some of the filter coefficients, temporarily or for an indefinite time period. In some embodiments, the predetermined operational threshold can comprise a standard deviation of the time difference ($\Delta t$) from a predetermined value.

In some vibratory flowmeter embodiments, the predetermined operational threshold can comprise a frequency (f) threshold. The frequency (f) comprises a frequency response received from a pick-off sensor(s). Consequently, if the frequency (f) falls outside of a normal or expected range, then the operation of the vibratory flowmeter has become abnormal and will likely require a high level of power consumption. In some embodiments, the predetermined operational threshold can comprise a standard deviation of the frequency (f) from a predetermined value.

In some vibratory flowmeter embodiments, the predetermined operational threshold can comprise a phase difference ($\Delta\theta$) threshold. The phase difference ($\Delta\theta$) comprises a phase difference in the vibrational response signals received from the pick-off sensors of the vibratory flowmeter. Consequently, if the phase difference ($\Delta\theta$) falls outside of a normal or expected range, then the operation of the vibratory flowmeter has become abnormal and will likely require a high level of power consumption. In some embodiments, the predetermined operational threshold can comprise a standard deviation of the phase difference ($\Delta\theta$) from a predetermined value.

In step 606, because the processing system has determined that the one or more processing system measurements have deviated beyond a normal operational range, then the previously denoted droppable operational filter coefficients are dropped. The dropping can occur for any desired time period, including indefinitely. For example, the dropping can occur for one or more main loop iterations of the processing system. However, other time periods are contemplated and are within the scope of the description and claims.

In step 607, the method can further determine if additional operational filter coefficients should be dropped (where some operational filter coefficients have already been dropped). The method determines the number of operational filter coefficients to be dropped based on an amount by which the one or more processing system measurements exceeds the predetermined power usage threshold. This step can assess the severity of the power consumption and can determine a graded level of operational coefficient dropping. For example, if previously dropped operational filter coefficients have had not enough effect, then the method can drop additional operational filter coefficients as needed. If more are to be dropped, then the method can loop back to step 606 and drop additional operational coefficients. In this manner, the operational filter coefficients can be dropped in an escalating fashion in order to avoid unnecessary impact on filtering operations. If no more operational filter coefficients are to be dropped, then the method branches back to step 605 and continues to monitor for operational changes.

In some embodiments, a user can participate in choosing initial and/or operational filter coefficients to be dropped. Dropping filter coefficients will enable a user to significantly increase a response speed of a processing system and the associated instrument or meter. For example, a user can specify the droppable operational filter coefficients. The associated instrument can operate normally under certain conditions. Under adverse or abnormal conditions, which can be specified by the user, the processing system can drop a predetermined number of filter coefficients and increase a response speed, at the expense of more noise. This gives the user increased control and greater operational flexibility. This allows the user to determine the optimal response time and/or power versus an acceptable noise and/or processor bandwidth for a particular application. This can be achieved without switching between multiple filters within the processing system or instrument.

What is claimed is:

1. A method for optimizing processor operation in a sensor-based vibratory flowmeter assembly processing system including one or more digital filters, the method comprising:
   generating initial filter coefficients for the one or more digital filters;
   determining one or more initial filter coefficients for at least one digital filter of the one or more digital filters that can be dropped based on filter performance and processing time, wherein a count of the initial filter coefficients comprises a total number of filter coefficients;
   dropping the one or more initial filter coefficients, wherein dropping the one or more initial filter coefficients reduces the total number of filter coefficients to be used by the processing system;
   programming remaining filter coefficients into the processing system before the processor operation; and
   comparing one or more processing system measurements to a power usage threshold comprising a vibrational response signal parameter threshold.

2. The method of claim 1, with the dropping further comprising dropping the one or more initial filter coefficients for at least one of a temporary time period and an indefinite time period.

3. The method of claim 1, wherein a digital filter of the one or more digital filters includes non-symmetric filter coefficients.

4. The method of claim 1, wherein a digital filter of the one or more digital filters includes symmetric filter coefficients.

5. The method of claim 1, wherein a digital filter of the one or more digital filters includes symmetric filter coefficients and wherein symmetric filter coefficients are dropped singly or in pairs.

6. The method of claim 1, further comprising:
   if the one or more processing system measurements exceeds the predetermined power usage threshold, then determining one or more operational filter coefficients for at least one digital filter of the one or more digital filters that can be dropped; and
   dropping the one or more operational filter coefficients, wherein dropping the one or more operational filter coefficients reduces the total number of operational filter coefficients to be used by the processing system during at least a current main loop processing iteration;
   wherein the power usage threshold comprises at least one of a predetermined time difference threshold, frequency threshold and phase difference threshold and the one or more processing system measurements comprises at least one of time difference, frequency, and phase difference measurements.

7. A method for adaptively optimizing processor operation in a sensor-based vibratory flowmeter assembly processing system including one or more digital filters, the method comprising:
   comparing one or more processing system measurements to a predetermined power usage threshold during operation, with the one or more processing system measurements comprising measurements generated by the processing system from sensor signals that sense vibrational response signals of the vibratory flow meter;
   if the one or more processing system measurements exceeds the predetermined power usage threshold, then determining one or more filter coefficients for at least one digital filter of the one or more digital filters that can be dropped; and
   dropping the one or more filter coefficients, wherein dropping the one or more filter coefficients reduces a total number of filter coefficients to be used by the processing system.

8. The method of claim 7, with the dropping further comprising dropping one or more filter coefficients for at least one of a temporary time period and an indefinite time period.

9. The method of claim 7, iteratively performing the comparing, determining, and processing steps.

10. The method of claim 7, wherein a digital filter of the one or more digital filters includes non-symmetric filter coefficients.

11. The method of claim 7, wherein a digital filter of the one or more digital filters includes symmetric filter coefficients.

12. The method of claim 7, wherein a digital filter of the one or more digital filters includes symmetric filter coefficients and wherein symmetric filter coefficients are dropped singly or in pairs.

13. The method of claim 7, further comprising determining a number of operational filter coefficients to be dropped based on an amount by which the one or more processing system measurements exceeds the predetermined power usage threshold.

14. The method of claim 7, further comprising the preliminary steps of:
   generating initial filter coefficients for the one or more digital filters;
   determining one or more initial filter coefficients for at least one digital filter of the one or more digital filters that can be dropped;
   dropping the one or more initial filter coefficients, wherein dropping the one or more initial filter coefficients reduces the total number of filter coefficients to be used by the processing system; and
   programming remaining initial filter coefficients into the processing system.

15. A method for optimizing processor operation in a sensor-based vibratory flowmeter assembly processing system including one or more digital filters, the method comprising:

generating filter coefficients for the one or more digital filters;

determining one or more initial filter coefficients and one or more operational filter coefficients for one or more digital filters of the one or more digital filters that can be dropped based on filter performance and processing time;

dropping the one or more initial filter coefficients, wherein dropping the one or more initial filter coefficients reduces a total number of filter coefficients to be used by the processing system;

programming remaining initial filter coefficients into the processing system before the processor operation;

comparing one or more processing system measurements comprising at least one of a phase difference, a frequency, a time difference, a density, a mass flow rate, a viscosity and a volume flow rate to a predetermined power usage threshold comprising at least one of a predetermined time difference threshold, a frequency threshold, and a phase difference threshold during operation, with the one or more processing system measurements comprising measurements generated by the processing system from vibrational response signals of the vibratory flow meter; and if the one or more processing system measurements exceeds the predetermined power usage threshold, then dropping the one or more operational filter coefficients, wherein dropping the one or more filter coefficients further reduces the total number of filter coefficients to be used by the processing system.

16. The method of claim 15, with the dropping further comprising dropping the one or more initial filter coefficients for at least one of a temporary time period and an indefinite time period.

17. The method of claim 15, wherein a digital filter of the one or more digital filters includes non-symmetric filter coefficients.

18. The method of claim 15, wherein a digital filter of the one or more digital filters includes symmetric filter coefficients.

19. The method of claim 15, wherein a digital filter of the one or more digital filters includes symmetric filter coefficients and wherein symmetric filter coefficients are dropped singly or in pairs.

20. The method of claim 15, iteratively performing the comparing and dropping steps for the one or more operational filter coefficients.

21. The method of claim 15, further comprising determining a number of operational filter coefficients to be dropped based on an amount by which the one or more processing system measurements exceeds the predetermined power usage threshold.

* * * * *